(12) United States Patent
Oguri

(10) Patent No.: US 7,148,724 B2
(45) Date of Patent: Dec. 12, 2006

(54) SIGNAL OUTPUT CIRCUIT

(75) Inventor: Hisao Oguri, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/411,806

(22) Filed: Apr. 27, 2006

(65) Prior Publication Data

US 2006/0244487 A1  Nov. 2, 2006

(30) Foreign Application Priority Data

May 2, 2005 (JP) ............................. 2005-134031

(51) Int. Cl.
*H03K 19/0175* (2006.01)
*H03K 19/82* (2006.01)
(52) U.S. Cl. ........................... 326/68; 326/63; 326/126
(58) Field of Classification Search ................ 326/62, 326/63, 68–74, 82, 89, 124, 126–128
See application file for complete search history.

(56) References Cited

U.S. PATENT DOCUMENTS

| | | | | |
|---|---|---|---|---|
| 5,089,789 A | * | 2/1992 | Van Tran | .................... 330/253 |
| 5,812,020 A | * | 9/1998 | Raghavan et al. | .......... 327/543 |
| 6,166,566 A | * | 12/2000 | Strong | .......................... 327/72 |
| 2002/0080651 A1 | * | 6/2002 | Tanzawa et al. | ........ 365/185.18 |
| 2003/0107425 A1 | * | 6/2003 | Yushan | ........................ 327/333 |
| 2005/0035788 A1 | * | 2/2005 | Devendorft et al. | .......... 327/65 |
| 2006/0012415 A1 | * | 1/2006 | Chen | ........................... 327/333 |

FOREIGN PATENT DOCUMENTS

JP  5-70020 U  9/1993

* cited by examiner

*Primary Examiner*—Don Le
(74) *Attorney, Agent, or Firm*—Sughrue Mion, PLLC

(57) ABSTRACT

The signal output circuit 1 includes a first and a second emitter follower circuit, and a comparator 20. The comparator 20 receives output signals from the first and the second emitter follower circuit, and outputs a result of comparison in magnitude between those signals. The comparator 20 includes a transistor T5 (fifth transistor), a transistor T6 (sixth transistor), a resistance element R3, and a current mirror circuit 30. The resistance element R3 connects the emitters of the transistor T5 and of the transistor T6. To the collectors of the transistor T5 and the transistor T6, the current mirror circuit 30 is connected.

3 Claims, 6 Drawing Sheets

SIGNAL OUTPUT CIRCUIT

This application is based on Japanese patent application NO.2005-134031, the content of which is incorporated hereinto by reference.

BACKGROUND

1. Technical Field

The present invention relates to a signal output circuit provided with an emitter follower.

2. Related Art

Most semiconductor-based circuits include an emitter follower that serves as a buffer or the like. The emitter follower generally includes a transistor and a constant current source provided on the emitter side of the transistor, so as to provide a constant current irrespective of whether a signal is input.

When the emitter follower is employed in a signal output circuit, a load such as a load resistance or a load capacitor is connected to the output. Such load reduces the operating speed of the emitter follower.

Accordingly, for example Japanese Laid-open utility model publication No.H05-70020 proposes employing a comparator to restrain the reduction in operating speed of the emitter follower. The circuit according to the publication includes a comparator to which an output voltage of the emitter follower and a reference voltage are input, so that the output of the comparator is connected to the constant current source of the emitter follower. A signal generated by the comparator representing a variation in output voltage of the emitter follower increases a current of the constant current source of the emitter follower. This serves to increase the operating speed of the emitter follower.

The signal output circuit according to the publication includes NPN-type transistors 101, 102, and a comparator 103, as shown in FIG. 6. The base of the transistor 101 is connected to an input signal terminal 104, the emitter thereof to a constant current source 105 and a load capacitor 106, and the collector thereof to a terminal of a load 107. The other terminal of the load 107 is connected to a high-voltage side power source (not shown).

The transistor 102, the base of which is connected to an output terminal of the comparator 103, is connected in parallel with the constant current source 105. The transistor 102 is turned on and off according to the output signal of the comparator 103. The comparator 103 compares a collector potential of the transistor 101 and a potential at the node between a load 108 and a constant current source 109 connected to a terminal of the load 108, and outputs the comparison result. Specifically, the collector potential of the transistor 101 is provided to a non-inverted input terminal of the comparator 103, and the potential at the above node is provided to the inverted input terminal. The other terminal of the load 108 is connected to the high-voltage side power source. The output of such signal output circuit appears at an output terminal 110 provided between the emitter of the transistor 101 and the load capacitor 106.

The signal output circuit shown in FIG. 6 operates as follows. When the base of the transistor 101 receives an input, in other words a high signal (H) is input thereto, the emitter potential of the transistor 101 varies in conformity therewith. During such variation of the emitter potential, the collector current of the transistor 101 increases, so that the collector potential of the transistor 101 decreases by a voltage obtained upon multiplying the current that has increased by the resistance value of the load 107. Also, the current that has increased flows to the load capacitor 106, thus to be charged therein. On the other hand, the potential at the node between the load 108 and the constant current source 109 remains constant irrespective of whether the signal has been input. At this stage, a difference in potential corresponding to the voltage generated by the foregoing current variation is created between the input terminals of the comparator 103, which, though, does not activate the comparator 103 yet.

Then the input signal falls to a low level (L) after being maintained at a high level for a certain period. This causes the emitter potential of the transistor 101 to drop to the low level from the high level. During such variation, the transistor 101 is temporarily turned off. At this moment the voltage fall that has been so far taking place at the load 107 ceases, thereby causing the collector voltage of the transistor 101 to increase. Since the collector voltage of the transistor 101 is input to one of the input terminals of the comparator 103, while the other input terminal of the comparator 103 receives a constant current as stated earlier, a difference in potential is created between the input terminals of the comparator 103.

At this stage, the potential provided to the non-inverted input terminal of the comparator 103 becomes higher than the potential provided to the inverted input terminal. Accordingly, the comparator 103 is turned on and outputs a high level. This turns on the transistor 102, which is connected to the output of the comparator 103, so as to cause the load capacitor 106 to discharge a current. The circuit shown in FIG. 6 thus prevents the reduction in operating speed caused by the discharge current of the load capacitor, during the falling edge of the input signal.

SUMMARY OF THE INVENTION

In the signal output circuit shown in FIG. 6, however, the comparator 103 may supply a current to the base of the transistor 102 even when no signal has been input to the input signal terminal 104, depending on the circuit configuration or connection arrangement of the comparator 103. In such a case the voltage between the base and the emitter of the transistor 102 excessively increases, thereby causing a shift in output offset voltage of the signal output circuit. Such shift in output offset voltage leads to degradation in performance of the signal output circuit.

According to the present invention, there is provided a signal output circuit comprising a first transistor of a first conduction type with a base connected to an input signal terminal; a first constant current source including a second transistor of the first conduction type with a collector connected to an emitter of the first transistor, thus constituting a first emitter follower circuit with the first transistor; a third transistor of the first conduction type with a base connected to the input signal terminal; a second constant current source including a fourth transistor of the first conduction type with a collector connected to an emitter of the third transistor, thus constituting a second emitter follower circuit with the third transistor; and a comparator that receives an output signal from the first and the second emitter follower circuit; wherein the comparator includes a fifth transistor of a second conduction type with a collector connected to a base of the fourth transistor, and driven by an output signal from the first emitter follower circuit, a sixth transistor of the second conduction type constituting a differential pair with the fifth transistor, and driven by an output signal of the second emitter follower circuit, a resistance element connecting respective emitters of the fifth and the sixth transistor, and a current mirror circuit connected to respective collectors of the fifth and the sixth transistor.

In the signal output circuit thus configured, when no signal is input to the input signal terminal, the collector currents of the fifth and the sixth transistor constituting the differential pair in the comparator are equal to each other. Here, the current mirror circuit is connected to the collectors of the fifth and the sixth transistor. Accordingly, the current running from the collector of the fifth transistor to the current mirror circuit becomes equal to the current running from the collector of the sixth transistor to the current mirror circuit, namely the collector current of the sixth transistor. Therefore, the collector current of the fifth transistor and the current running from the collector of the fifth transistor to the current mirror circuit becomes equal to each other.

Such configuration can keep a current from running from the collector of the fifth transistor, which is the output of the comparator, to the base of the fourth transistor included in the second constant current source constituting the second emitter follower circuit. Consequently, the shift in output offset voltage can be restricted.

Thus, the present invention provides a signal output circuit capable of restraining the reduction in operating speed, as well as the shift in output offset voltage.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
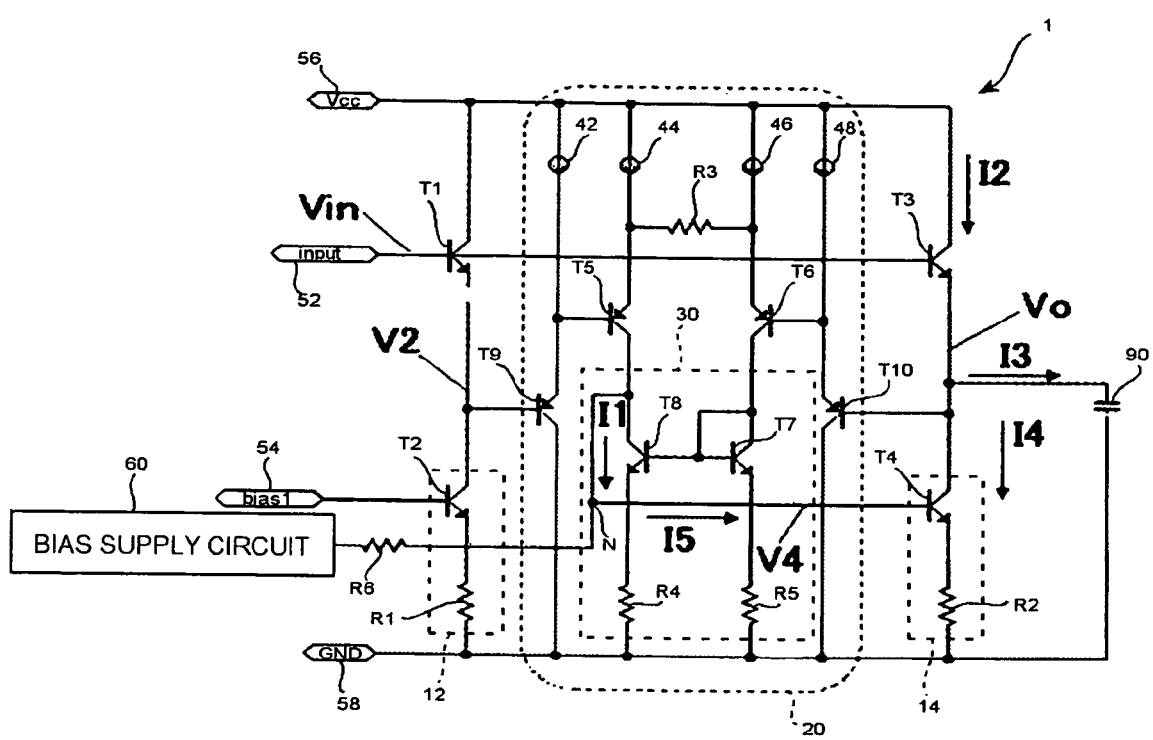
FIG. 1 is a circuit diagram of a signal output circuit according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an exemplary embodiment of a signal output circuit according to the present invention will be described in details, referring to the accompanying drawings. In the drawings, same constituents are given the identical numerals, and duplicating description may be omitted where appropriate.

FIG. 1 is a circuit diagram of the signal output circuit according to the embodiment of the present invention. The signal output circuit 1 includes a first and a second emitter follower circuit, and a comparator 20. To the second emitter follower circuit an output load capacitor 90 is connected, and an output of the second emitter follower circuit acts as the output of the signal output circuit 1. In contrast, the first emitter follower circuit is a dummy emitter follower circuit.

The first emitter follower circuit includes a transistor T1 (first transistor) and a constant current source 12 (first constant current source). The transistor T1 is a NPN-type bipolar transistor, with the base connected to an input signal terminal 52. The collector of the transistor T1 is connected to a power supply terminal 56.

The constant current source 12 includes a transistor T2 (second transistor) and a resistance element R1. The transistor T2 is a NPN-type bipolar transistor, with the collector connected to the emitter of the transistor T1. The base of the transistor T2 is connected to a bias signal terminal 54. The resistance element R1 has a terminal connected to the emitter of the transistor T2, and the other terminal connected to a ground terminal 58. The constant current source 12 constitutes the first emitter follower circuit with the transistor T1.

The second emitter follower circuit includes a transistor T3 (third transistor) and a constant current source 14 (second constant current source). The transistor T3 is a NPN-type bipolar transistor, with the base connected to the input signal terminal 52. The collector of the transistor T3 is connected to the power supply terminal 56.

The constant current source 14 includes a transistor T4 (fourth transistor) and a resistance element R2. The transistor T4 is a NPN-type bipolar transistor, with the collector connected to the emitter of the transistor T3. The base of the transistor T4 is connected to a bias supply circuit 60 via a resistance element R6. The resistance element R2 has a terminal connected to the emitter of the transistor T4, and the other terminal connected to the ground terminal 58. The constant current source 14 constitutes the second emitter follower circuit with the transistor T3.

The comparator 20 receives output signals from the first and the second emitter follower circuits, and outputs a result of comparison in magnitude between those signals. Such output signal is input to the base of the transistor T4. The comparator 20 includes a transistor T5 (fifth transistor), a transistor T6 (sixth transistor), a resistance element R3, and a current mirror circuit 30.

The transistor T5 is a PNP-type bipolar transistor, with the collector connected to the base of the transistor T4. The collector potential of the transistor T5 becomes the output of the comparator 20. The transistor T5 is driven by the output signal from the first emitter follower circuit. The transistor T6 is a PNP-type bipolar transistor, and constitutes a differential pair with the transistor T5. The transistor T6 is driven by the output signal from the second emitter follower circuit.

The resistance element R3 connects the emitters of the transistor T5 and of the transistor T6. That is, a terminal of the resistance element R3 is connected to the emitter of the transistor T5, and the other terminal is connected to the emitter of the transistor T6.

To the collectors of the transistor T5 and the transistor T6, the current mirror circuit 30 is connected. The current mirror circuit 30 includes a transistor T7 (seventh transistor), a transistor T8 (eighth transistor), a resistance element R4, and a resistance element R5.

The transistor T7 is an NPN-type bipolar transistor, with the collector connected to the collector of the transistor T6. The collector and the base of the transistor T7 are connected to each other. Likewise, the transistor T8 is an NPN-type bipolar transistor, with the collector connected to the collector of the transistor T5. The base of the transistor T8 is connected to the base of the transistor T7.

The resistance element R4 has a terminal connected to the emitter of the transistor T8, and the other terminal to the ground terminal 58. Likewise, the resistance element R5 has a terminal connected to the emitter of the transistor T7, and the other terminal to the ground terminal 58.

Further, the comparator 20 includes a transistor T9 (ninth transistor), a transistor T10 (tenth transistor), and constant current sources 42, 44, 46, 48.

The transistor T9 is a PNP-type transistor, and connected to the transistor T5 by Darlington connection. That is, the emitter of the transistor T9 is connected to the base of the transistor T5. The base of the transistor T9 is connected to the output of the first emitter follower circuit, namely the emitter of the transistor T1. The collector of the transistor T9 is connected to the ground terminal 58.

The transistor T10 is a PNP-type transistor, and connected to the transistor T6 by Darlington connection. That is, the emitter of the transistor T10 is connected to the base of the transistor T6. The base of the transistor T10 is connected to the output of the second emitter follower circuit, namely the emitter of the transistor T3. The collector of the transistor T10 is connected to the ground terminal 58.

The constant current source 42 has a terminal connected to the emitter of the transistor T9 (base of the transistor T5), and the other terminal to the power supply terminal 56. The constant current source 44 has a terminal connected to the emitter of the transistor T5, and the other terminal to the power supply terminal 56. The constant current source 46 has a terminal connected to the emitter of the transistor T6, and the other terminal to the power supply terminal 56. The constant current source 48 has a terminal connected to the emitter of the transistor T10 (base of the transistor T6), and the other terminal to the power supply terminal 56.

Figure 2:
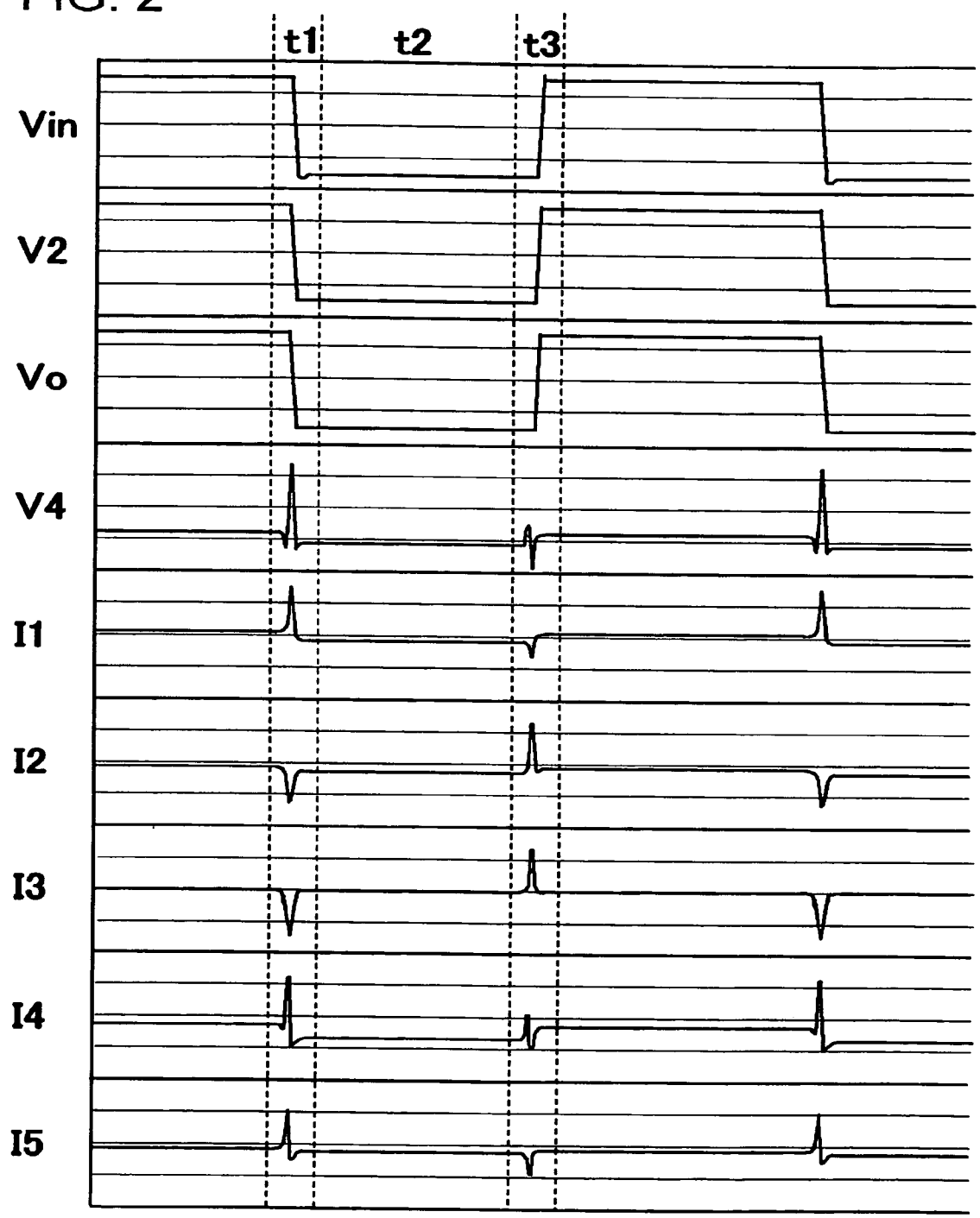
FIG. 2 is a timing chart for explaining an operation of the signal output circuit shown in FIG. 1.

Referring to FIG. 2, an operation of the signal output circuit 1 will be described. Firstly, in a period t1 in FIG. 2, a signal $V_{in}$, provided to the bases of the transistors T1, T3, respectively included in the first and the second emitter follower, is on a falling edge. Then an emitter potential V2 of the transistor T1 and an emitter potential V0 of the transistor T3 follow up a variation of the respective base potentials, thus to fall. The falling time of such process is different between the emitter follower circuits.

To be more detailed, the load capacitor 90 is connected to the output of the second emitter follower circuit, as already described. Accordingly, the falling time of the emitter potential of the transistor T3 becomes longer than that of the transistor T1, because of including the time to receive a discharge current from the load capacitor 90. On the other hand, since the output of the first emitter follower circuit is not connected to the load capacitor, the falling time of the emitter potential of the transistor T1 becomes shorter than that of the transistor T3.

Figure 3:
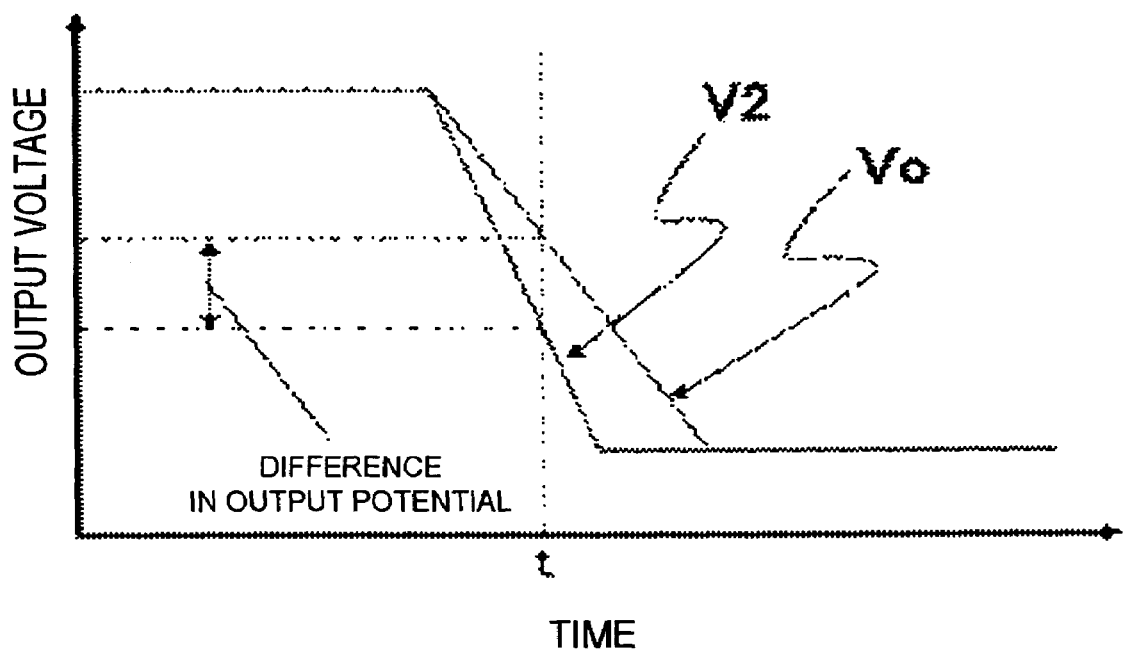
FIG. 3 is a graph for explaining an operation of the signal output circuit shown in FIG. 1.

Referring here to FIG. 3, upon comparison between the output potentials V2, V0 of the first and the second emitter follower circuit after a certain time t from the moment that the input signal $V_{in}$ has started to change, the output potential V2 proves to be lower because of the shorter falling time.

The emitter potential V2 of the transistor T1 is free from a discharge current and hence follows up the variation of the input signal $V_{in}$, because there is no capacitor comparable to the output load capacitor 90 (approx. scores of pF) among those electrically seen from the emitter of the transistor T1. On the other hand, the emitter potential V0 of the transistor T3 attempts to acquire the discharge current from the output load capacitor 90. However, since the current value of the second emitter follower circuit is determined by the constant current source 14, it takes a certain time for the transistor T3 to acquire the discharge current, which retards the variation of the emitter potential V0. Therefore, between the potential V2 and the potential V0 after a certain time t since the input starts to fall, the potential V0 becomes higher than the potential V2.

Under such state, a low signal (L) is input to the base of the transistor T9, which serves as an input terminal of the comparator 20, while a high signal (H) input to the base of the transistor T10, which serves as the other input terminal. This creates a difference between base-emitter voltages of the transistors T9, T5 of the comparator 20, so that the collector current so far supplied to the transistors T5, T6 now concentrates at the transistor T5, without any variation in the total amount. The increment of the collector current of the transistor T5 flows from the constant current source 46 to the emitter of the transistor T5, through the resistance element R3. Accordingly, the collector current of the transistor T6 is decreased, by the same amount as supplied to the transistor T5.

The decreased collector current of the transistor T6 flows into the collector of the transistor T7. The transistor T7, which constitutes the current mirror circuit 30 with the transistor T8 as already stated, attempts to supply the same amount of current as the collector current of the transistor T7, to the collector of the transistor T8.

To the base of the transistor T4, therefore, a current I1 which is a remainder upon deducting the collector current of the transistor T8 from the collector current of the transistor T5 is supplied. This increases a base current I5 of the transistor T4, thereby also increasing a current I4 running through the second emitter follower circuit. This consequently enables the load capacitor 90 to supply a discharge current I3.

Then during a period t2 in FIG. 2, the input signal $V_{in}$ is maintained low. Accordingly, the emitter potential V2 of the transistor T1 as well as the emitter potential V0 of the transistor T3 remain constant, at the low level. The comparator 20 is not activated, because the potentials V2, V0 received through the input terminals are equal. The current I1 from the comparator 20 is therefore zero, and hence the current I4 flowing through the second emitter follower circuit also remains in the same value as it has been so far.

The above is followed by a period t3 in FIG. 2, where the input signal $V_{in}$ enters a rising edge. Then the emitter potentials V2, V0 of the transistors T1, T3 follow up this variation, thus to rise to the high level. At this moment, a collector current I2 of the transistor T3 increases so as to charge the load capacitor 90 connected to the emitter the transistor T3. During such process the potentials V2, V0 are generally equal to each other, and hence the comparator 20 is not activated.

The signal output circuit 1 offers the following advantageous effect. In the signal output circuit 1, the base potentials of the transistors T9, T10, which corresponds to the input to the comparator 20, are equal to each other, when the input signal $V_{in}$ is not provided to the input signal terminal 52. Under such state, the base-emitter voltages of the transistors T9, T10 become equal to each other, thereby making the base-emitter voltages of the transistors T5, T6 also equal to each other. Accordingly, the collector currents of the transistors T5, T6 become equal to each other, at a current value determined by the constant current sources 44, 46. Such collector current of the transistor T6 flows into the collector of the transistor T7. This activates the current mirror circuit 30 so as to supply the transistor T8 with the same collector current as the transistor T7.

Therefore, the collector current of the transistor T5 and the current about to be supplied to the collector of the transistor T8 become equal, and hence no current from the collector of the transistor T5 is supplied to the node N between the base of the transistor T4 and the bias supply circuit 60. Consequently, no impact is applied to the current running through the second emitter follower circuit, and therefore the output offset voltage can be prevented from shifting.

Figure 4:
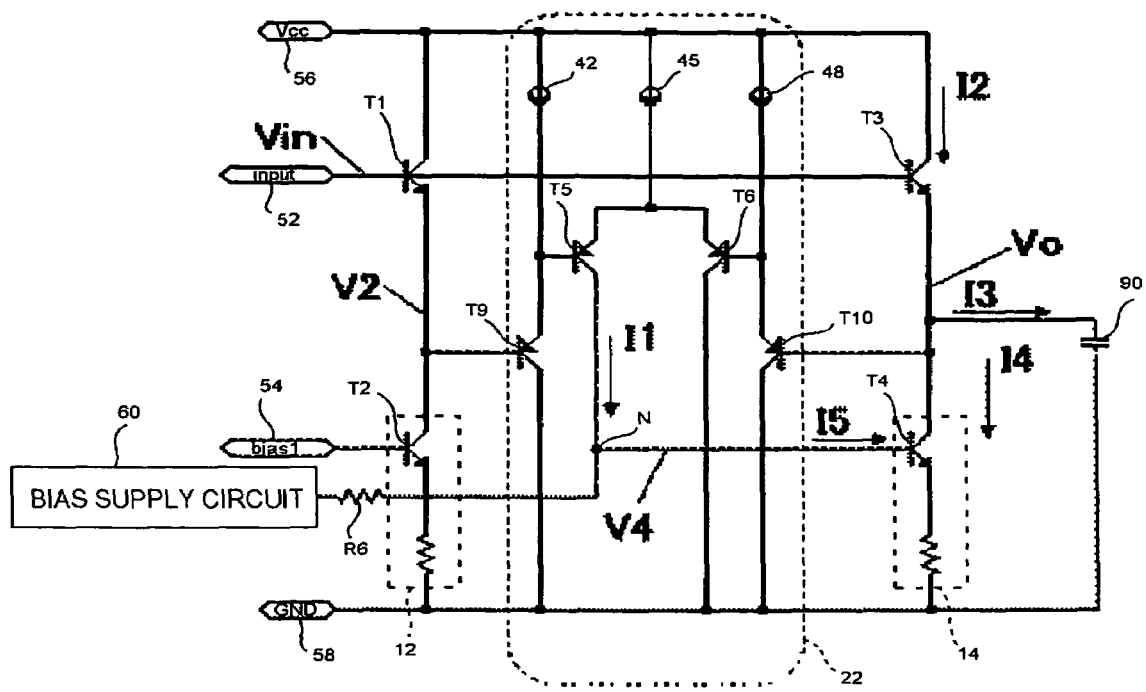
FIG. 4 is a circuit diagram of a comparative signal output circuit with respect to the embodiment.

FIG. 4 is a circuit diagram of a comparative signal output circuit with respect to the signal output circuit 1. The signal output circuit shown in FIG. 4 includes a first and a second emitter follower circuit, and a comparator 22. Out of these, the emitter follower circuits are similarly configured to those included in the signal output circuit 1. The comparator 22 is similar to the comparator 20 in the signal output circuit 1 in including the transistors T5, T6, T9, T10 and the constant current sources 42, 48, but different from the comparator 20 in not including the resistance element R3 and the current mirror circuit 30.

In the comparator 22, the respective emitters of the transistors T5, T6 are directly connected to each other. To these emitters, a terminal of a constant current source 45 is connected. The other terminal of the constant current source 45 is connected to the power supply terminal 56. The collector of the transistor T6 is connected to the ground terminal 58.

Figure 5:
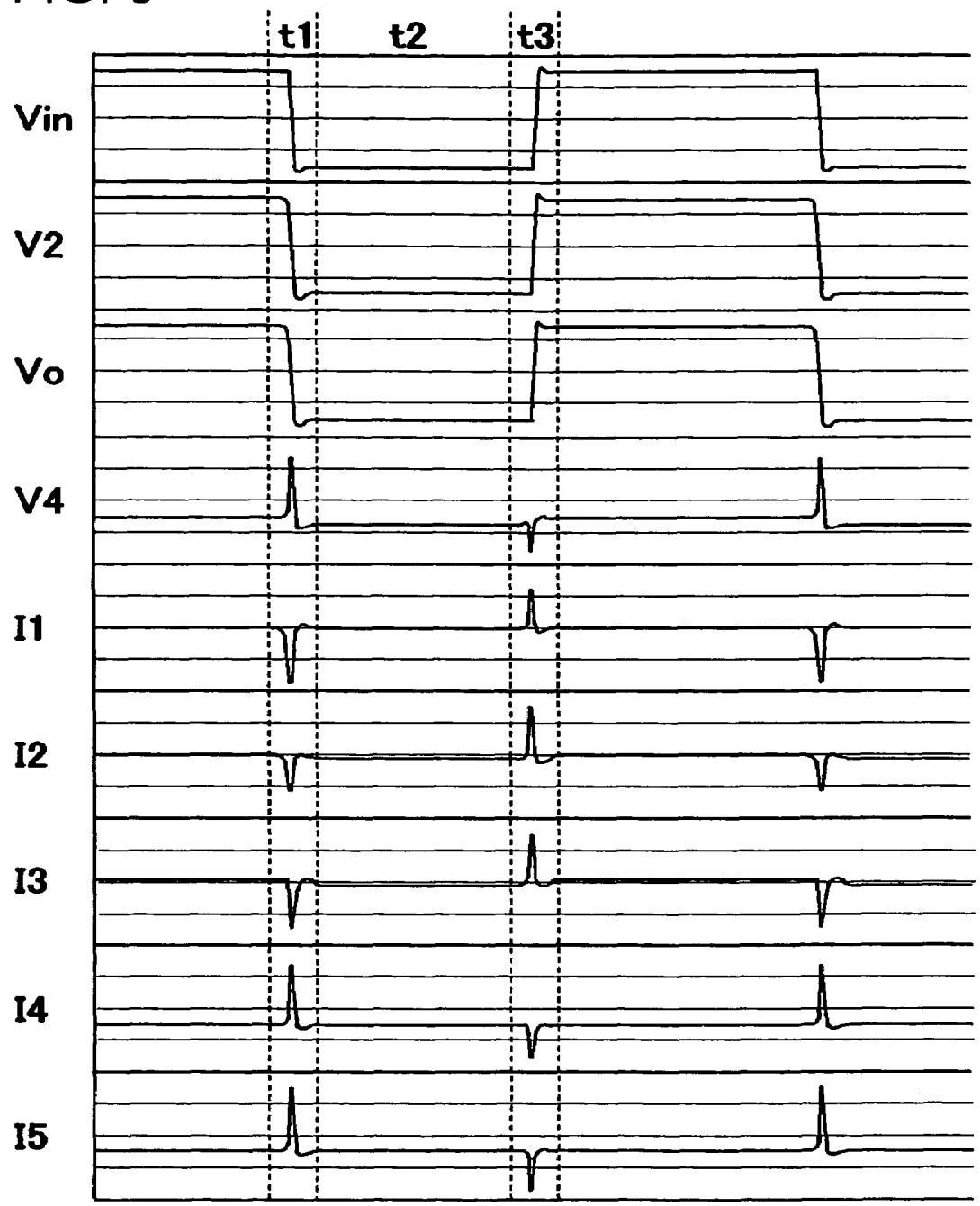
FIG. 5 is a timing chart for explaining an operation of the signal output circuit shown in FIG. 4.
Figure 6:
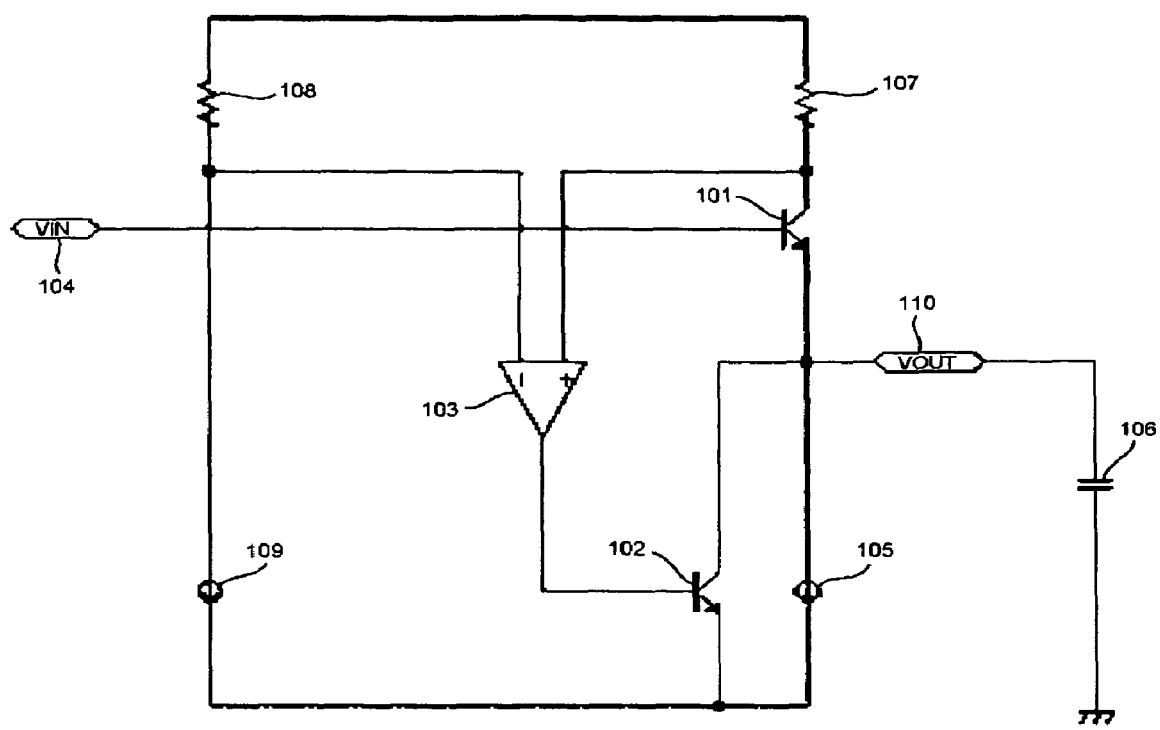
FIG. 6 is a circuit diagram of a signal output circuit according to Japanese Laid-open utility model publication No.H05-70020.

Referring to FIG. 5, an operation of the signal output circuit of FIG. 4 will be described. Firstly, in a period t1 in FIG. 5, a signal $V_{in}$, provided to the base of the transistors T1, T3, respectively included in the first and the second emitter follower, is on a falling edge. Then an emitter potential V2 of the transistor T1 and an emitter potential V0 of the transistor T3 follow up a variation of the respective base potentials, thus to fall. The falling time in this process is different between the emitter follower circuits, as described referring to FIG. 3.

The different output potentials V2, V0 are input to the comparator 22. Because of the difference between the output potentials, the collector current so far supplied to the transistors T5, T6 now concentrates at the transistor T5. Such collector current I1 is supplied to the base of the transistor T4 included in the constant current source 14 constituting the second emitter follower circuit. Here, the decrease in the output potential V0 leads to a decrease in collector-emitter voltage of the transistor T4 thereby saturating the transistor T4, so that the transistor T4 incurs a reduction in current amplification factor hfe, thus falling in need of a large amount of base current. The signal output circuit of FIG. 4 can, therefore, supply a sufficient base current I5 to the transistor T4 under such situation, thus enabling the load capacitor 90 to supply a discharge current.

During a period t2 in FIG. 5, the input signal $V_{in}$ is maintained low. Accordingly, the emitter potentials V2, V0 of the respective emitter follower circuits both remain low, and hence the comparator 22 is not activated and the current I1 only includes a current of an ordinary state.

Then in a period t3 in FIG. 5, the input signal $V_{in}$ enters a rising edge. Following up this variation, the emitter potentials V2, V0 of the respective emitter follower circuits change. A collector current I2 of the transistor T3 in the second emitter follower circuit increases so as to charge the load capacitor 90. During such process the potentials V2, V0 are generally equal to each other, and hence the comparator 22 is not activated, and no current is supplied from the comparator 22 to the base of the transistor T4 constituting the constant current source 14 in the second emitter follower circuit.

In the signal output circuit shown in FIG. 4, the current set value of the comparator 22 is determined by the setting of the constant current source 45, so that a half of the current value of the constant current source 45 is constantly supplied to the node N between the base of the transistor T4 and the bias supply circuit 60, when no input signal is provided. Accordingly, a current from the bias supply circuit 60 to supply the collector current I4 to the transistor T4, and a portion of the current from the output of the comparator 22 (collector of the transistor T5) are supplied to the base of the transistor T4. In addition, the remaining portion of the current from the output of the comparator 22 is supplied to the bias supply circuit 60.

The above process increases the base potential of the transistor T4, thereby increasing the base current thereof. This causes an increase in the collector current of the transistor T4, as well as in the collector current of the transistor T3. Thus, the current in the second emitter follower circuit is increased. As a result, the base-emitter voltage of the transistor T3 is increased, which provokes a shift in the output offset voltage.

Unlike the above, in the signal output circuit 1 shown in FIG. 1, the comparator 20 includes the resistance element R3 and the current mirror circuit 30 as already described. Such configuration enables preventing a shift in the output offset voltage.

Further, the current mirror circuit 30 includes the transistor T7 with the collector connected to the collector of the transistor T6 and with the collector and the base connected to each other, and the transistor T8 with the collector connected to the collector of the transistor T5 and with the base connected to the base of the transistor T7. Thus, the current mirror circuit is achieved with such simplified configuration.

Further, the comparator 20 includes the transistors T9, T10 respectively connected to the transistors T5, T6 by Darlington connection. This allows increasing the apparent current amplification factor of the transistors T5, T6. However, providing the transistors T9, T10 in the signal output circuit 1 is not imperative, and instead the respective outputs of the first and the second emitter follower circuit may be directly input to the base of the transistors T5, T6.

It is apparent that the present invention is not limited to the above embodiment, and may be modified and changed without departing from the scope and spirit of the invention.

What is claimed is:

1. A signal output circuit comprising:
   a first transistor of a first conduction type with a base connected to an input signal terminal;
   a first constant current source including a second transistor of said first conduction type with a collector connected to an emitter of said first transistor, thus constituting a first emitter follower circuit with said first transistor;
   a third transistor of said first conduction type with a base connected to said input signal terminal;
   a second constant current source including a fourth transistor of said first conduction type with a collector connected to an emitter of said third transistor, thus constituting a second emitter follower circuit with said third transistor; and
   a comparator that receives an output signal from said first and said second emitter follower circuit;

wherein said comparator includes a fifth transistor of a second conduction type with a collector connected to a base of said fourth transistor, and driven by an output signal from said first emitter follower circuit, a sixth transistor of said second conduction type constituting a differential pair with said fifth transistor, and driven by an output signal of said second emitter follower circuit, a resistance element connecting respective emitters of said fifth and said sixth transistor, and a current mirror circuit connected to respective collectors of said fifth and said sixth transistor.

2. The signal output circuit according to claim 1, wherein said current mirror circuit includes a seventh transistor of said first conduction type, with a collector connected to said collector of said sixth transistor, and to a base of said seventh transistor, and an eighth transistor of said first conduction type, with a collector connected to said collector of said fifth transistor, and with a base connected to said base of said seventh transistor.

3. The signal output circuit according to claim 1, wherein said comparator includes a ninth transistor with a base connected to said emitter of said first transistor, and with an emitter connected to a base of said fifth transistor, and a tenth transistor with a base connected to said emitter of said third transistor, and with an emitter connected to a base of said sixth transistor.

* * * * *